United States Patent
Leu

(10) Patent No.: US 6,648,215 B2
(45) Date of Patent: Nov. 18, 2003

(54) METHOD AND APPARATUS FOR MOUNTING SEMICONDUCTOR CHIPS

(75) Inventor: Felix Leu, Zug (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 09/951,097

(22) Filed: Sep. 12, 2001

(65) Prior Publication Data
US 2002/0030089 A1 Mar. 14, 2002

(30) Foreign Application Priority Data
Sep. 12, 2000 (CH) .............................. 1768/00

(51) Int. Cl.⁷ .......................... B23K 31/00; B23K 37/00
(52) U.S. Cl. .................. 228/248.1; 228/44.3; 228/47.1
(58) Field of Search ............................. 228/248.1, 44.3, 228/47.1

(56) References Cited

U.S. PATENT DOCUMENTS

| | | | | |
|---|---|---|---|---|
| 4,875,279 A | * | 10/1989 | Sakiadis | 156/497 |
| 5,144,747 A | * | 9/1992 | Eichelberger | 257/700 |
| 5,351,872 A | | 10/1994 | Kobayashi | 228/6.2 |
| 5,688,716 A | * | 11/1997 | DiStefano et al. | 438/121 |
| 5,894,657 A | * | 4/1999 | Kanayama et al. | 29/740 |
| 6,176,966 B1 | * | 1/2001 | Tsujimoto et al. | 156/344 |
| 6,219,911 B1 | * | 4/2001 | Estes et al. | 29/740 |
| 6,284,564 B1 | * | 9/2001 | Balch et al. | 438/106 |

FOREIGN PATENT DOCUMENTS

| | | | | |
|---|---|---|---|---|
| JP | 01041230 | 2/1989 | ............ | 21/52 |
| JP | 10340931 | 12/1997 | ............ | 21/60 |
| JP | 11260840 | 9/1999 | ............ | 21/52 |

OTHER PUBLICATIONS

Copy of the European Search report.

* cited by examiner

Primary Examiner—M. Alexandra Elva
Assistant Examiner—Zidia Pittman
(74) Attorney, Agent, or Firm—Thelen Reid & Priest LLP; David B. Ritchie

(57) ABSTRACT

With the mounting of a semiconductor chip onto a substrate having a portion of adhesive the bondhead is lowered to a predetermined height H above a support holding the substrate. At the same time, the pick-up tool is fixed in an upper limit position on the bondhead. As soon as the bondhead has reached the height H, the fixing of the pick-up tool is released so that the pick-up tool moves downwards from the upper limit position and presses the semiconductor chip onto the adhesive. After a predetermined time after releasing the fixing of the pick-up tool, the bondhead is raised and moved away.

Figure 1A:
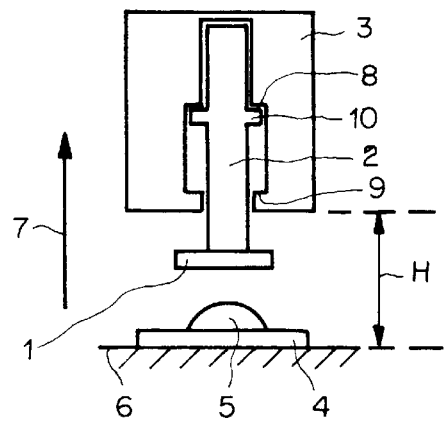

With a bondhead particularly suited for the method, the pick-up tool and the bondhead are connected by means of a chamber to which compressed air and/or vacuum can be applied so that, to a large extent, the movement of the pick-up tool can be controlled.

6 Claims, 2 Drawing Sheets

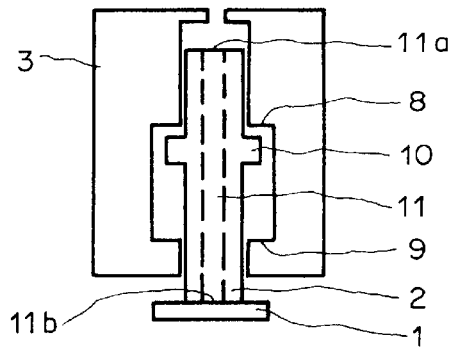
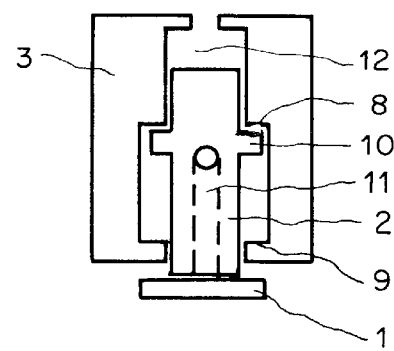
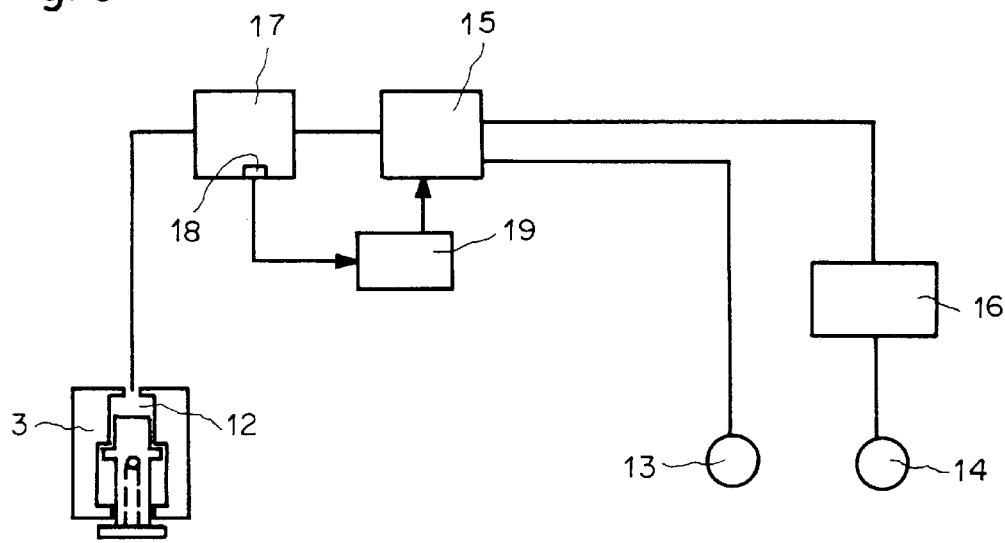

METHOD AND APPARATUS FOR MOUNTING SEMICONDUCTOR CHIPS

PRIORITY CLAIM

The present application claims priority under 35 U.S.C § 119 based upon Swiss Patent Application No. 2000 1768/00 filed on Sep. 12, 2000.

FIELD OF THE INVENTION

The invention concerns a method and an apparatus for mounting semiconductor chips.

BACKGROUND OF THE INVENTION

With the mounting of semiconductor chips, the substrate is fed by a transport arrangement in cycles to a dispensing station where adhesive is applied and then to a bonding station where the next semiconductor chip is placed. With increasing miniaturisation of the electronic structures, the semiconductor chips for certain applications also become very small. The dimensions of the smallest semiconductor chips already amount to less than 0.2 mm*0.2 mm. If the adhesive layer between the substrate and the semiconductor chip consists of an electrically conducting adhesive, the task is set of mounting the tiny semiconductor chips so that, after hardening, the thickness of the adhesive layer between the substrate and the semiconductor chip is uniform and only varies within tight given tolerances for example of only ±5 $\mu$m. Only in this way can a consistently high quality of the electrical characteristics of the mounted semiconductor chips be achieved. Furthermore, it is demanded that substrate from different manufacturers can be used which means that the thickness of the substrate to be processed is subject to deviations of typically 60 to 70 $\mu$m.

Today, a method generally known as "overtravel" is used to compensate the thickness variations of the substrate. The automatic assembly machine, a so-called die bonder, comprises a bondhead with a pick-up tool to pick up the semiconductor chip. The bondhead is lowered to a predetermined height above the substrate which is set so that, in any case, the semiconductor chip impacts on the adhesive portion regardless of the actual thickness of the substrate. In doing so, on the one hand the adhesive is compressed and, on the other hand, the pick-up tool is deflected in relation to the bondhead. The thickness of the resulting adhesive layer is subject to large variations.

The object of the invention is to propose a method and an apparatus for the mounting of semiconductor chips which fulfils the above-mentioned requirements.

BRIEF DESCRIPTION OF THE INVENTION

Solving of the task is achieved with a method by which the semiconductor chip is deposited on the adhesive portion under controlled conditions. Decisive for achieving an adhesive layer with negligible thickness variations is that the impact of the semiconductor chip on the adhesive portion is considerably reduced in comparison with prior art. This is achieved in that it is not the semiconductor chip and the entire bondhead which impact on the adhesive but only the semiconductor chip and a small part of the bondhead, namely the pick-up tool at the tip of which the semiconductor chip is located.

With the mounting of a semiconductor chip onto a substrate having a portion of adhesive the bondhead is therefore lowered to a predetermined height H above a support holding the substrate where as a rule the semiconductor chip does not yet touch the adhesive or only just touches so that the portion of adhesive is only negligibly deformed. At the same time, the pick-up tool is fixed in an upper limit position on the bondhead. As soon as the bondhead has reached the height H, the fixing of the pick-up tool is released so that the pick-up tool moves downwards from the upper limit position and presses the semiconductor chip onto the adhesive. After a predetermined time after releasing the fixing of the pick-up tool, the bondhead is raised and moved away.

With a bondhead particularly suited for the method, the pickup tool and the bondhead are connected by means of a chamber to which compressed air and/or vacuum can be applied so that, to a large extent, the movement of the pick-up tool can be controlled.

The method according to the invention and the embodiments of apparatus suitable for carrying out the method are now explained in more detail based on the drawing.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention.

Figure 2:
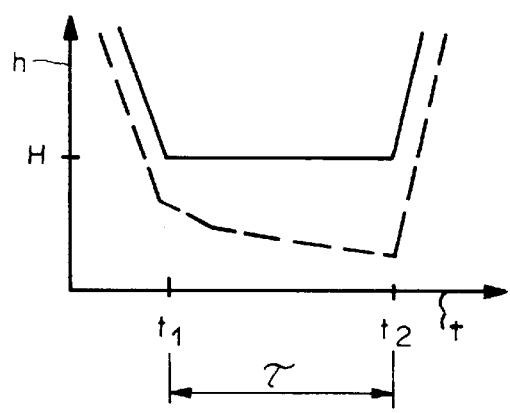

In the drawings:

FIGS. 1A, B show two phases of the method according to the invention,

FIG. 2 is a diagram schematically illustrating the course of the height of a bondhead and of a pick-up tool in accordance with the invention, FIGS. 3, 4 show details of an apparatus suitable for carrying out the method, and FIG. 5 shows additional parts of the apparatus according to FIG. 4.

DETAILED DESCRIPTION OF THE INVENTION

Figure 1B:
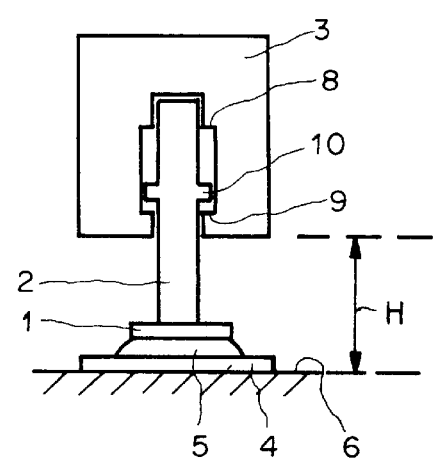

FIGS. 1A and 1B show consecutive phases of the method according to the invention. The two figures show a semiconductor chip 1, a pick-up tool 2, a bondhead 3, a substrate 4, a portion of adhesive 5 and a support 6 for the substrate 4. The pick-up tool 2 is part of the bondhead 3. The pick-up tool 2 is movable in vertical direction 7 between an upper limit position and a lower limit position which are defined for example by means of a cam 10 on the pick-up tool 2 combined with stop surfaces 8 and 9. The pick-up tool 2 is freely movable, ie, movement of the pick-up tool 2 is not counteracted by a spring.

When mounting the semiconductor chip 1, in a first stage the bondhead 3 is lowered to a predetermined height H above the support 6 during which the pick-up tool 2 is located in the upper limit position. This condition is presented in FIG. 1A. The height H is predetermined corresponding to the greatest expected thickness of the substrate 4 and the greatest height $H_1$ of the adhesive 5 so that as a rule the semiconductor chip 1 which is located at the tip of the pickup tool 2 does not yet touch the adhesive 5 or only just touches so that the portion of adhesive is only negligibly deformed.

The bondhead 3 now remains at the height H. Now, in a second stage, the attachment of the pick-up tool 2 on the bondhead 3 is released so that the pick-up tool 2 lowers as the result of gravity. The semiconductor chip 1 impacts on the adhesive 5 and sinks deeper and deeper into the adhesive 5 whereby the thickness of the adhesive layer continually reduces. Although the adhesive 5 provides a certain resistance to its deformation and therefore to the sinking of the semiconductor chip 1, it is not able to compensate the weight of the pick-up tool 2. In order to stop the semiconductor chip 1 from sinking, the bondhead 3 must be moved away. That is why the moving away of the bondhead 3 takes place in a third stage at a predetermined time τ after releasing the pick-up tool 2.

The condition immediately before the moving away of the bondhead 3 is presented in FIG. 1B. The fall time of the pick-up tool 2 from the point of its release from the bondhead 3 up to the first contact with the adhesive 5 is short in comparison with the time τ. In this way, a layer thickness of the adhesive 5 is achieved which is practically independent of the actual thickness of the substrate 4. With frictionless guiding of the pick-up tool 2 on the bondhead 3, the impact of the semiconductor chip 1 on the adhesive 5 is proportional to the mass of semiconductor chip 1 and pick-up tool 2 and therefore considerably less than with the "overtravel" method quoted. Furthermore, the effect of the mass being reduced to the mass of the pick-up tool 2 causes a slower lowering of the semiconductor chip 1 on the adhesive 5.

In FIG. 2 a solid line shows the course of the height h of the bondhead 3 above the support 6 and a broken line shows the course of the height h of the pick-up tool 2 above the support 6 over the course of time t. At time $t_1$, the bondhead arrives at height H, remains at height H for the period of time τ and at time $t_2$ moves away again without the semiconductor chip. Until the height H is achieved, the pick-up tool 2 is fixed in its upper limit position on the bondhead 3, after releasing itself from the bondhead 3 it falls somewhat faster until it meets with the adhesive 5 and then sinks somewhat slower into the adhesive 5.

FIG. 3 shows details of a first apparatus for carrying out the method in accordance with the invention. With this apparatus, the pick-up tool 2 has a continuous longitudinal drill hole 11 to the upper end of which vacuum can be applied to grip the semiconductor chip 1. When gripping the semiconductor chip 1, the longitudinal drill hole 11 is sealed at the lower end. In doing so, as the result of the pressure differential between the lower and upper ends of the longitudinal drill hole 11, a force directed upwards is created which is sufficient to push the pick-up tool 2 to the upper limit position: In this way, the pick-up tool 2 is fixed in the upper limit position on the bondhead 3.

After the bondhead 3 has achieved the position shown in FIG. 1A, the vacuum at the upper end of the longitudinal drill hole 11 is switched off. The force directed upwards acting on the pick-up tool 2 reduces continuously with continual reduction of the vacuum: The pickup tool 2 falls downwards, the semiconductor chip 1 impacts on the adhesive 5 and compresses the adhesive 5 more and more until, after the period of time τ, the bondhead 3 is raised and moved away. As long as the vacuum is not completely broken down, the semiconductor chip 1 remains attached to the pick-up tool 2. Therefore, the placing of the semiconductor chip 1 on the adhesive 5 takes place in a controlled manner under the guidance of the pick-up tool 2. After the time τ has elapsed, the vacuum has also broken down sufficiently so that when it is raised, the bondhead 3 leaves the semiconductor chip 1 on the adhesive 5.

FIG. 4 shows details of a second apparatus for carrying out the method in accordance with the invention. With this apparatus, the functions "holding the component" and "dropping the pick-up tool 2" are separated. The bondhead 3 comprises a chamber 12 to which compressed air or vacuum can be applied in which the upper end of the pick-up tool 2 runs on air-tight bearings. When vacuum is applied to the chamber 12, then the pick-up tool 2 is pushed into its upper limit position. When compressed air is applied to the chamber 12, then the pick-up tool 2 is pushed into its lower limit position. In addition, the pick-up tool 2 has a longitudinal drill hole 11 which can be connected to a vacuum source.

To grip the semiconductor chip 1, compressed air is applied to the chamber 12 whereby the pressure in the chamber 12 is controlled at a predetermined value $p_1$. When gripping the semiconductor chip 1, the bondhead 3 is lowered far enough so that the force built up between the semiconductor chip 1 and the pick-up tool 2 is sufficient to deflect the pick-up tool 2 out of its lower limit position. This force $F_1$ is independent of the degree of deflection. It is determined by the cross-sectional area A on which the pressure $p_1$ in chamber 12 acts on the pick-up tool 2: $F_1 = p_i * A$. Now, at the latest, vacuum is applied to the longitudinal drill hole 11 so that the semiconductor chip 1 adheres to the pick-up tool 2 and can be picked up.

After the semiconductor chip 1 has been gripped, vacuum is applied to the chamber 12 in order to move the pick-up tool 2 into its upper limit position. As with the first embodiment, the bondhead 3 is now transported to the substrate 4 (FIG. 1A) and, in a first stage, is lowered to the predetermined height H above the support 6. The bondhead 3 now remains at the height H. The vacuum in the chamber 12 is now removed so that the pick-up tool 2 lowers in relation to the bondhead 3. The bondhead 3 remains at height H during time τ which begins at the time when the vacuum is removed and ends with the raising and moving away of the bondhead 3. This dwell time τ of the bondhead 3 at height H determines the extent to which the semiconductor chip 1 compresses the adhesive 5, ie, which adhesive thickness is achieved. In order that the bondhead 3 can move away without the bonded semiconductor chip 1, the vacuum in the longitudinal drill hole 11 must be removed in due time before the dwell time τ elapses.

This second embodiment has the advantage that, during the time τ, the strength of the vacuum or negative pressure in the chamber 12 can be controlled according to a given pressure profile so that the lowering of the semiconductor chip 1 onto the adhesive 5 takes place with controlled speed. In particular, the lowering speed can be reduced in comparison to the case of the sudden removal of the vacuum.

Furthermore, the second embodiment is suitable for the placing of relatively large semiconductor chips onto a substrate 4 where it is desired that the semiconductor chip 1 is pressed onto the substrate with a predetermined bond force. During transport of the bondhead 3 to the substrate 4, a predetermined overpressure $p_2$ is applied to the chamber 12. The overpressure $p_2$ and the height $H_1$ above the support 6 to which the bondhead 3 is lowered are selected so that the pick-up tool 2 is deflected upwards in vertical direction 7 in relation to the bondhead 3 whereby the cam 10 strikes neither at the top on stop surface 8 nor at the bottom on stop surface 9. The semiconductor chip 1 is then pressed onto the adhesive 5 with a defined bond force $F_2 = p_2 * A$ whereby the bond force $F_2$ exerted by the pick-up tool 2 on the semiconductor chip 1 is independent of the thickness of the substrate. The layer thickness of the adhesive 5 which results is dependent on the volume of the applied portion of adhesive and on pressure $p_2$.

FIG. 5 shows a device for controlling the pressure in the chamber 12 of the bondhead 3. The device has a compressed air source 13 and a vacuum source 14 which are connected by a proportional valve 15. The vacuum source 14 is preferably connected to the proportional valve 15 via a vacuum reservoir 16. The outlet of the proportional valve 15 is connected to a pressure chamber 17 the volume of which is at least ten times larger than the volume of the chamber 12 when the pick-up tool 2 is located at the lower limit position. A pressure sensor 18 is located in the pressure chamber 17 for measuring the pressure p prevailing inside it. The signal delivered by the pressure sensor 18 is fed to a control device 19 which controls the proportional valve 15 so that the pressure p in the pressure chamber 17 corresponds to a given value. The pressure chamber 17 is connected to the chamber 12 of the bondhead 3 so that the same pressure is set in the chamber 12 as in the pressure chamber 17. The longitudinal drill hole 11 of the pick-up tool 2 can be separately connected to the vacuum source 14 via a not presented switchable valve for gripping and releasing the semiconductor chip 1.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for mounting a semiconductor chip onto a substrate having a portion of adhesive, the method comprising the following steps:
    a) Presenting a substrate having a portion of adhesive on a support;
    b) Gripping a semiconductor chip by means of a pick-up tool movable on a bondhead in a vertical direction between an upper limit position and a lower limit position;
    c) Lowering the bondhead to a predetermined height above the support whereby the pick-up tool is fixed in the upper limit position on the bondhead,
    d) Releasing the fixing of the pick-up tool so that the pick-up tool falls downwards towards the adhesive and presses the semiconductor chip onto the adhesive while the bondhead remains at said height; and
    e) Raising and moving away of the bondhead at a predetermined time after releasing the fixing of the pick-up tool.

2. The method according to claim 1, wherein the fixing of the pick-up tool on the bondhead takes place by means of vacuum.

3. The method according to claim 1, wherein the pick-up tool bears on a chamber on the bondhead to which vacuum can be applied and wherein a strength of the vacuum is controlled in accordance with a given time profile in order to control a lowering speed of the pick-up tool in step c.

4. The method according to claim 2, wherein the pick-up tool bears on a chamber on the bondhead to which vacuum can be applied and wherein a strength of the vacuum is controlled in accordance with a given time profile in order to control a lowering speed of the pick-up tool in step c.

5. An apparatus for mounting a semiconductor chip onto a substrate having a portion of adhesive, the apparatus comprising a bondhead with a pick-up tool freely movable in a vertical direction between an upper limit position and a lower limit position wherein the bondhead contains a chamber to which compressed air and/or vacuum can be applied and in which an upper end of the pick-up tool runs on air-tight bearings and wherein the chamber is connected to a pressure chamber the volume of which is at least ten times larger than the volume of the chamber.

6. An apparatus for mounting a semiconductor chip onto a substrate having a portion of adhesive, the apparatus comprising a bondhead with a pick-up tool, wherein the pick-up tool is freely movable in a vertical direction between an upper limit position and a lower limit position and wherein the bondhead contains a chamber to which compressed air and/or vacuum can be applied and in which an upper end of the pick-up tool runs on air-tight bearings, wherein the chamber is connected to a pressure chamber the volume of which is at least ten times larger than the volume of the chamber, the apparatus adapted to:
    present a substrate having a portion of adhesive on a support;
    move the bondhead carrying the semiconductor chip to a position over the substrate;
    fix the pickup tool in the upper limit position by means of vacuum;
    lower the bondhead to a predetermined height above the support;
    release the fixing of the pick-up tool so that the pick-up tool falls downwards towards the adhesive and presses the semiconductor chip onto the adhesive while the bondhead remains at said height;
    control a falling speed of the pick-up tool by controlling a strength of the vacuum in the chamber in accordance with a given time profile; and
    raise and move away of the bondhead at a predetermined time after releasing the fixing of the pick-up tool.

* * * * *